(12) United States Patent
Ashkenazy et al.

(10) Patent No.: US 10,361,621 B2
(45) Date of Patent: Jul. 23, 2019

(54) DC POWER SUPPLY WITH REDUCED INPUT CURRENT RIPPLE

(71) Applicant: Elbit Systems of America, LLC, Fort Worth, TX (US)

(72) Inventors: Eli Ashkenazy, Fort Worth, TX (US); Jesse Terrell, Fort Worth, TX (US)

(73) Assignee: Elbit Systems of America, LLC, Fort Worth, TX (US)

( * ) Notice: Subject to any disclaimer, the term of this patent is extended or adjusted under 35 U.S.C. 154(b) by 0 days.

(21) Appl. No.: 15/872,890

(22) Filed: Jan. 16, 2018

(65) Prior Publication Data

US 2019/0115824 A1     Apr. 18, 2019

Related U.S. Application Data

(60) Provisional application No. 62/573,990, filed on Oct. 18, 2017.

(51) Int. Cl.
| | | |
|---|---|---|
| *H02M 1/14* | (2006.01) | |
| *H02M 3/04* | (2006.01) | |
| *B64G 1/44* | (2006.01) | |
| *G01R 19/00* | (2006.01) | |
| *G05F 1/62* | (2006.01) | |

(52) U.S. Cl.
CPC ............ *H02M 1/14* (2013.01); *H02M 3/04* (2013.01); *B64G 1/443* (2013.01); *G01R 19/0084* (2013.01); *G05F 1/62* (2013.01)

(58) Field of Classification Search
CPC ........ H02M 1/14; H02M 1/146; H02M 5/293; H02M 3/04; G05F 1/62; B64G 1/443; G01R 19/0084

USPC .......................................................... 323/234
See application file for complete search history.

(56) References Cited

U.S. PATENT DOCUMENTS

| | | | | |
|---|---|---|---|---|
| 5,091,837 A | * | 2/1992 | Duspiva ............ | H02M 3/33576 363/15 |
| 5,436,820 A | * | 7/1995 | Furmanczyk ........... | H02M 1/36 363/41 |
| 5,499,184 A | * | 3/1996 | Squibb .............. | H02M 3/33523 363/100 |
| 7,259,971 B1 | * | 8/2007 | Allen ...................... | H02M 3/28 361/789 |
| 8,872,501 B2 | * | 10/2014 | Dong .................... | H02M 3/156 323/282 |
| 9,690,315 B2 | | 6/2017 | Baker et al. | |
| 2005/0140346 A1 | | 6/2005 | Ashkenazy | |
| 2006/0171182 A1 | * | 8/2006 | Siri .................. | H02M 3/33592 363/131 |
| 2010/0181828 A1 | * | 7/2010 | Handa ...................... | B60L 7/16 307/9.1 |

(Continued)

FOREIGN PATENT DOCUMENTS

WO          2013077936          5/2013

*Primary Examiner* — Yemane Mehari
(74) *Attorney, Agent, or Firm* — Conley Rose PC

(57) ABSTRACT

A power supply comprising a DC to DC converter coupled to a current limited controller and an accumulator is disclosed, where the DC to DC converter may be a switch-mode DC to DC converter. The current limit controller may be configured to limit a current draw of the switch-mode DC to DC converter. The accumulator may be configured to discharge to an output terminal of the DC to DC converter while the current limit controller limits the current draw of the DC to DC converter.

20 Claims, 3 Drawing Sheets

(56) References Cited

U.S. PATENT DOCUMENTS

2015/0036397 A1* 2/2015 Wang .................. H02M 1/32
363/55

* cited by examiner

DC POWER SUPPLY WITH REDUCED INPUT CURRENT RIPPLE

CROSS-REFERENCE TO RELATED APPLICATIONS

This application claims the benefit of U.S. Provisional Application Ser. No. 62/573,990 filed Oct. 18, 2017 and titled "DC POWER SUPPLY WITH REDUCED RIPPLE," which is hereby incorporated by reference in its entirety.

STATEMENT REGARDING FEDERALLY SPONSORED RESEARCH OR DEVELOPMENT

None.

BACKGROUND

Many modern communications systems use waveforms that employ techniques such as frequency hopping, time division multiplexing, and vector modulation. These complex waveforms can cause noise and ripple effects on the input power supply lines, such as low frequency, high current pulse modulation. Additionally, harmonics and intermodulation distortion may also be created, which can extend the frequency impact to frequencies significantly higher than those directly associated with the waveform. It is advantageous to create a direct current (DC) power supply that provides more input line stability and can overcome the effects of using such modern waveforms, while minimizing its size and weight and maximizing its power efficiency.

SUMMARY

A DC power supply comprising a switch-mode DC to DC converter. A current limit controller is used to limit the current draw of the switch-mode DC to DC converter. An energy storage device charges from the switch-mode DC to DC converter and discharges while the current limit controller is limiting the current draw of the switch-mode DC to DC converter.

BRIEF DESCRIPTION OF THE DRAWINGS

For a detailed description of various embodiments, reference will now be made to the accompanying drawings in which.

DETAILED DESCRIPTION

The following discussion is directed to various embodiments. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The use of complex waveforms in modern communications systems may create noise and stability issues on the input power supply lines within modern electronics. These issues may include high frequency noise, as well as low frequency ripple. The high frequency components may be effectively filtered with the use of lumped elements, but the required capacitance and inductance values tend to be very large, with current handling capability below what would be necessary for the low frequency signals. The presence of high current, low frequency ripple may also create an alternating current (AC) voltage drop on the power supply lines. This voltage drop may interfere with other systems and cause systems to fail testing requirements. For example, the United States military requires certain equipment to pass electromagnetic interference (EMI) and Tempest tests (such as MIL-STD-461 CE 101). These kinds of tests seek to limit or prevent equipment from interfering with other devices or from leaking information susceptible to eavesdropping or intelligence gathering (such as through unintentional radio or electrical signals, sounds, and vibrations).

Systems and devices that may benefit from an improved DC power supply include, for example, aircraft and military mobile communication units. Aircraft often use 28 volt (V) DC power systems. In various embodiments, the aircraft may provide 28 V DC power to the communications system, though the use of other voltage levels is also contemplated in this description. A military mobile communications unit may utilize a modern communications system that would benefit from an improved DC power supply. In various embodiments, the military mobile communications unit may be powered by a 28V DC power supply, though use of other voltage levels is also contemplated in this disclosure. In addition to aircraft and military mobile communications units, other communications systems may also benefit from an improved DC power supply (e.g., cellular equipment, radio transceivers). Equipment other than communications equipment may benefit from an improved DC power supply as disclosed herein.

Figure 1:
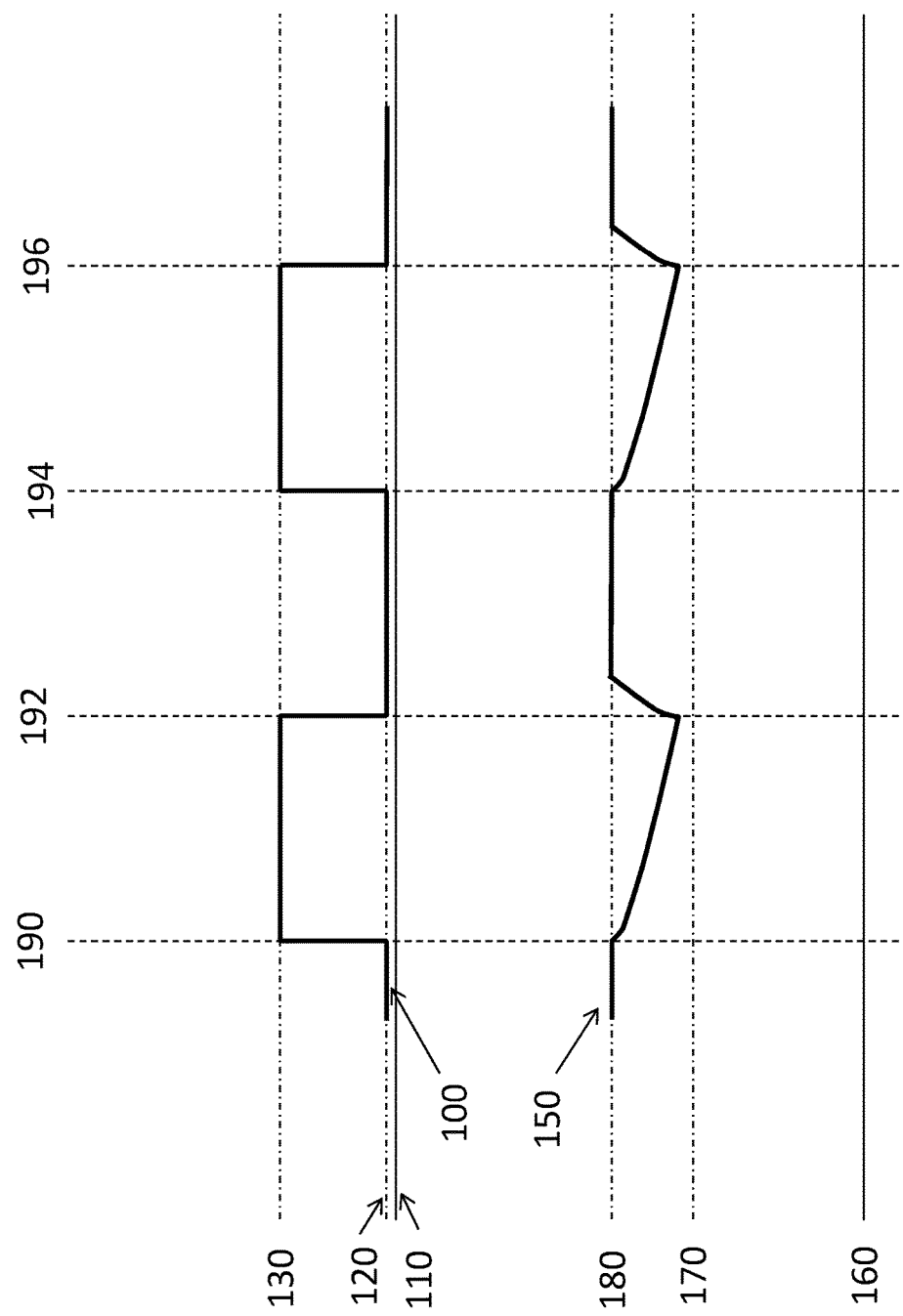
FIG. 1 shows current and voltage waveforms according to at least some embodiments.

FIG. 1 shows a current waveform 100 and a voltage waveform 150 according to various embodiments. The waveforms are not necessarily drawn to scale. Current waveform 100 shows an idealized current draw on a DC power supply according to at least some embodiments. Current waveform 100 depicts a current draw that alternates between a low current value 120 and a high current value 130. Current is often described in terms of Amperes (Amps or A) or milli-Amperes (mA). The low current value 120 may be a small positive value above 0 (zero) Amps 110, such as 50 mA. The high current value 130 may be a larger value, such as 5 A. At a first point in time 190 and third point in time 194, the current waveform 100 may change from a low current value 120 to a high current value 130. At a second point in time 192 and a fourth point in time 196, the current waveform may change from a high current value 130 to a low current value 120. In at least some embodiments, current waveform 100 may rise at the first and third points in time 190, 194 when a power amplifier or other large power component or sub-system activates or needs more power, and the current waveform 100 may fall at the second and third points in time 192, 194 when the power amplifier or other large power component or sub-system deactivates or needs less power. The current waveform 100 may take a non-zero amount of time to rise or fall between the low current value 120 and the high current value 130. FIG. 1 shows a possible rise and fall of current waveform 100 as periodic. But in various embodiments the rise and fall of the current waveform 100 may be aperiodic. In various embodiments, current waveform 100 may rise and fall between the same low current value 120 and high current value 130, while in other embodiments, current waveform 100 may rise to a high current value 130 of 5 A at a first point in time 190, but rise to a different current value at another point in time (e.g., 4 A). Similarly, in various embodiments, the current waveform 100 may fall to a low current value 120 of 50 mA at a second point in time 192, but fall to a different current value (e.g., 100 mA) at a different point in time.

In various embodiments, the rise and fall of the current waveform may be periodic. The period may correspond to various states of the overall system. For example, a communication system may alternate between transmit and receive modes. Prior to the first point in time 190, the system may be operating in a receive mode that draws a low current value 120. During the receive mode, the system may be receiving signals on an antenna, but not need to provide much or any power to a power amplifier or transmission circuitry. The system may switch to a transmit mode at a first point in time 190 and remain in transmit mode until a second point in time 192. Between the first and second points in time 190, 192, the system may draw a high current value 130. This current may be required to provide power to a power amplifier or transmission circuitry. The system may return to a receive mode at a second point in time 192, to a transmit mode at a third point in time 194, and again to a receive mode at a fourth point in time 196.

As depicted in FIG. 1, the current waveform may be periodic. For example, the system may cycle between a high current draw and low current draw at 30 Hertz (Hz). The cycle rate may be longer or shorter than 30 Hz. The cycle rate may also change (increase and/or decrease in Hz) during operation of the system. As depicted in FIG. 1, the duration of the high and low current draws may be the same, but the system may use unequal durations for the high and low current draws. For example, the system may have a low current draw of 40 milliseconds (mS) and a high current draw of 60 mS, with a period of 100 mS (a 10 Hz cycle rate). Depending on the system, the low current draw duration or high current draw duration may be the longer of the two.

The specific current waveform 100 depicted in FIG. 1 is not intended to be limiting. A DC power supply could support many other current requirements. In various embodiments the current waveform 100 could have three (3) or more different values of current draws and switch between them randomly or in a pattern. One or more of such values of current draws may be higher than the DC power supply can provide for an extended duration of time, but may be provided for a short duration of time.

Voltage waveform 150 shows a possible voltage output value of a DC power supply. FIG. 1 shows a possible voltage waveform 150 in relation to 0 (zero) V 160. Prior to a first point in time 190, the voltage waveform 150 may be at a target voltage value 180. The target voltage value 180 may be 28 V, which is typically used for power on aircraft such as an aircraft, though over voltage values are also contemplated. After the first point in time 190, the voltage waveform 150 may decay in value. The decay in the voltage waveform's 150 value may be at least partially caused by a high current draw on the DC power supply. The decay may be linear, exponential, or any other change in voltage value. As depicted in FIG. 1, the voltage waveform 150 may begin recovery at a second point in time 192. The recovery may be at least partially caused by a change in the current draw on the DC power supply from a high current value 130 to a low current value 120. The recovery may be linear, exponential, or any other change in voltage value. The voltage waveform 150 may decay again at a third point in time 194 and recover at a fourth point in time 196. The decay and recovery of a voltage waveform 150 may be referred to as a ripple. As shown in FIG. 1, the voltage waveform 150 recovers quickly relative to the size of the duty cycle. In various embodiments, the recovery may occur more quickly relative to the duty cycle, or more slowly (and potentially not even fully recover before the next high current draw.

Electronic devices may be built to tolerate a range of voltage values from a DC power supply. While the electronic devices may be built with a target voltage value 180 in mind, they may typically continue proper operations within a range of voltage values extending above and below the target voltage value 180. A potential minimum required voltage 170 is depicted on FIG. 1 at a lower voltage value than the target voltage value 180. A device could be built that requires at least the minimum required voltage 170 to operate correctly. Such a device may have a maximum tolerated voltage (not depicted in FIG. 1) greater than or equal to the target voltage value). For example, if a device has a target voltage value 180 of 28 V, the minimum required voltage 170 may be 24 V, and the maximum tolerated voltage may be 30 V. Other voltage values for the target voltage value 180, minimum required voltage 170 and maximum tolerated voltage are contemplated. In various embodiments, going above the maximum tolerated voltage or below the minimum required voltage may result in immediate device failure. In various embodiments, a device may initially operate if the voltage waveform 150 extends above the maximum tolerated voltage (an over-voltage condition) or below the minimum required voltage (an under-voltage condition), but fail after a length of time in an under-/over-voltage condition. In various embodiments a device may continue to operate in an under-/over-voltage condition, but with reduced functionality or increased chance for errors. Some devices may be designed with specifications for a minimum required voltage 170 and maximum tolerated voltage that are higher or lower, respectively, than the voltage values where the device will actually begin to fail. In various embodiments the target voltage value 180 may not be the ideal operating voltage for the powered components (such as a power amplifier). For example, in some embodiments the target voltage value may be higher than the ideal operating voltage (but still smaller than the maximum tolerated voltage) in order to prevent the voltage waveform's 150 voltage value from decaying below the minimum required voltage 170 when the system is drawing a high current value 130.

Figure 2:
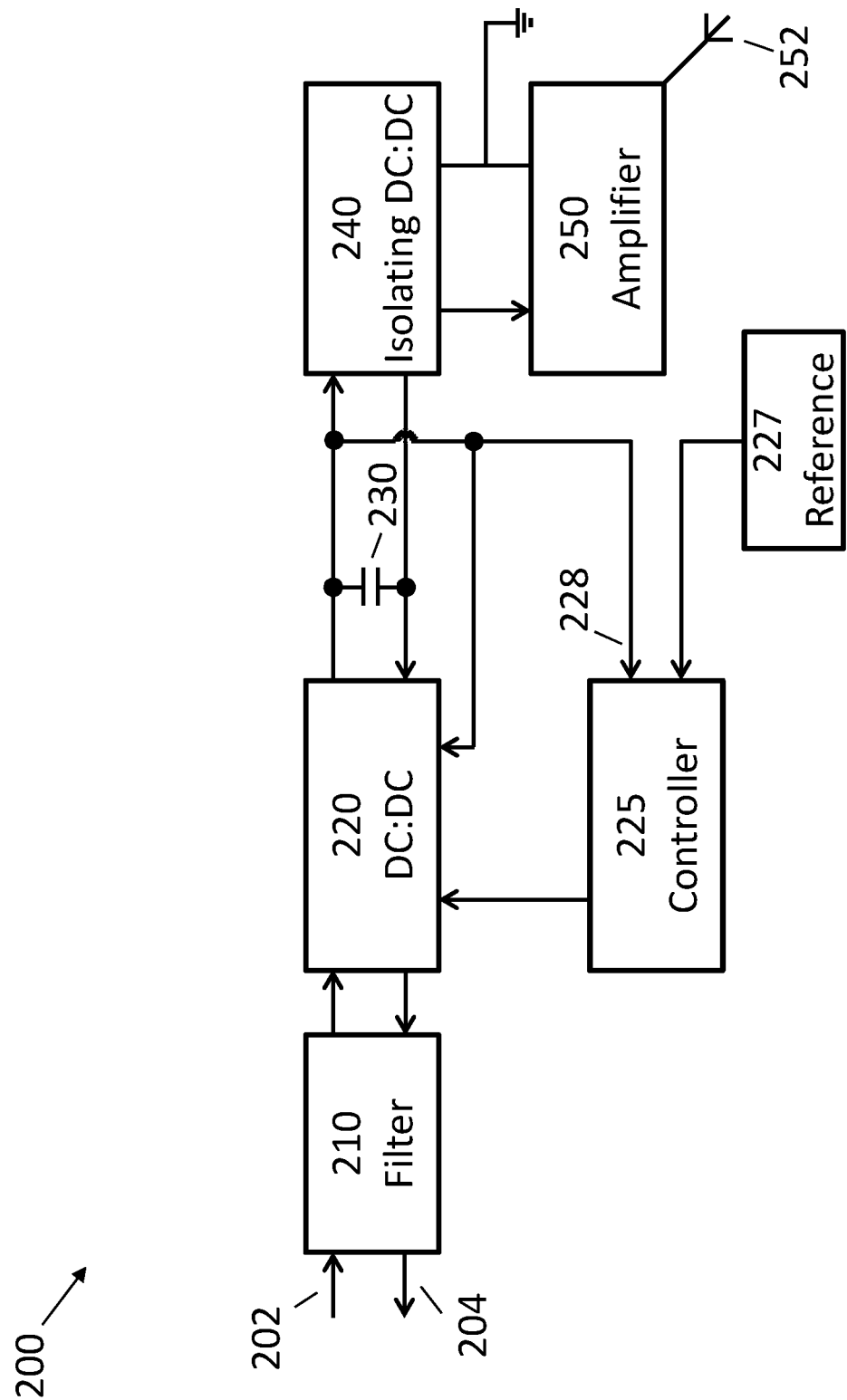
FIG. 2 shows a block diagram of a DC power supply and load according to at least some embodiments.

FIG. 2 shows a block diagram of a DC power supply and load 200 according to at least some embodiments. The DC power supply may comprise a DC input filter 210, switch-mode DC to DC converter 220, isolating DC to DC converter 240, current limit control circuit 225, and voltage reference 227. A load may comprise a power amplifier 250 and antenna 252. Input power may be supplied to the DC power supply via a primary voltage input 202 and primary return 204. A DC input filter 210 may be coupled to primary voltage input 202 and primary return 204 and may be used to filter the primary voltage input 202 and primary return 204. In various embodiments, the DC input filter 210 may be implemented as a passive RLC (resistor (R), inductor (L), capacitor (C)) circuit. In various embodiments, the DC input filter 210 may smooth out the voltage or current being provided to the DC power supply via the primary voltage input 202 and primary return 204. In various embodiments, the DC input filter 210 may filter out high-frequency noise (such as high-frequency harmonics) that would otherwise appear on the primary voltage input 202 and primary return 204 during operation of the overall system. High frequency noise may include variations in the voltage at a rate of 10 Hz or more. In various embodiments, the DC input filter 210 cannot fully filter out high-frequency noise, but only reduce the noise. The DC power supply may further comprise a switch-mode DC to DC converter 220 that may be coupled to the DC input filter 210. The switch-mode DC to DC converter 220 can convert the DC voltage provided by the DC input filter 210 to a higher voltage, lower voltage, or to the same voltage.

In various embodiments, the switch-mode DC to DC converter 220 may output a DC voltage value by creating a square wave and filtering the square wave (such as with a low-pass filter) to create a DC voltage value. The low-pass filter may be a passive filter (such as one creating using inductive and capacitive elements) or an active filter. The switch-mode DC to DC converter 220 may adjust the DC voltage value by modifying the square wave's duty cycle. The duty cycle of the square wave is the proportion of time the square wave at its higher voltage. For example, using a square wave that alternates between 0 V and 10 V with a 50% duty cycle may result in a DC voltage value of approximately 5 V, while an 80% duty cycle may result in a DC voltage value of approximately 8 V and a 20% duty cycle may result in a DC voltage value of approximately 2 V.

In various embodiments, current limit control circuit 225 may control the switch-mode DC to DC converter 220 via one or more analog or digital signals. In various embodiments, the current limit control circuit 225 may specify a voltage to be generated by the switch mode DC to DC converter 220. In various embodiments, the current limit control circuit 225 may specify which duty cycle the switch-mode DC to DC converter uses in generating a voltage.

The switch-mode DC to DC converter 220 may be controlled at least in part by a current limit control circuit 225. The current limit control circuit 225 may control the switch-mode DC to DC converter 220 at least in part based on a voltage output of the switch-mode DC to DC converter 220 (such via a voltage feedback 228) and a voltage reference 227. The voltage reference 227 may be a programmable voltage reference and may remain constant or be changed during normal operation of the DC power supply. The voltage reference 227 may also be set during calibration, such as an external calibration or self-calibration. The self-calibration may be performed during startup of the DC power supply. A hold-up capacitor 230 may be coupled to the switch-mode DC to DC converter 220. While FIG. 2 depicts a single capacitor for the hold-up capacitor 230, in various embodiments any appropriate accumulator may be used. An accumulator is an energy storage device and may accept, store, and release energy as needed. Accumulators may include capacitors, rechargeable batteries, and compensated pulse alternators, though any appropriate accumulator is considered. In various embodiments the hold-up capacitor 230 may actually be one or more capacitors (or other elements that provide a capacitive effect or accumulators) coupled in parallel or series. When the current draw on the DC power supply is low, the switch-mode DC to DC converter 220 may charge the hold-up capacitor 230. The hold-up capacitor 230 may be discharged when the current draw on the DC power supply is high. The DC power supply may further comprise an isolating DC to DC converter 240 and a power amplifier 250. The isolating DC to DC converter 240 may be coupled in parallel to the hold-up capacitor 230 and configured to provide power to a power amplifier 250. The isolating DC to DC converter 240 may convert the DC voltage to a higher voltage, a lower voltage, or the same voltage. In various embodiments, the isolating DC to DC converter 240 may convert the DC voltage to the same voltage in order to provide isolation between various components. The power amplifier 250 may be used to transmit signals of a communications system over an antenna 252.

In various embodiments, the primary voltage input 202 and the primary return 204 provide DC power to the DC power supply. The DC power may be provided by a battery, a motor, another DC power supply, an AC to DC converter, or some other source of DC power.

In various embodiments, the primary voltage input 202 and primary return 204 provide DC power as a constant voltage source, but only at a limited current. The switch-mode DC to DC converter 220 may include a control loop to regulate its output voltage. The current limit control circuit 225 may control the current consumption of the switch-mode DC to DC converter 220. This may cause the switch-mode DC to DC converter 220 to act as a near-constant voltage source. The current limit control circuit 225 may otherwise affect the operation of the control loop in the DC to DC converter 220, such as overriding or modifying input, output, or control signals. DC to Power Supply may be calibrated to affect the kind of operations or how much change the current limit control circuit 225 can introduce to the control loop and related circuitry of DC to DC converter 220. With renewed reference to FIG. 1, instead of providing a constant voltage, the switch-mode DC to DC converter 220 may be configured to provide a voltage lower than the target voltage value 180 when the current draw on the switch-mode DC to DC converter is high (such as at a high current value 130). To limit the current drawn from the primary voltage input 202 and primary return 204, the current limit control circuit 225 may reduce the duty cycle of the square wave used by the switch-mode DC to DC converter 220. When the current draw on the DC power supply is a high current value 130, such as the current waveform 100 between a first point in time 190 and a second point in time 192, the current limit control circuit 225 may reduce the voltage output of the switch-mode DC to DC converter 220. The hold-up capacitor 230 may discharge, allowing a gradual decay of the voltage waveform 150 while the switch-mode DC to DC converter 220 is being current limited. In various embodiments, the switch-mode DC to DC converter 220 may be operating as a near-constant current source when it is being limited by the current limit control circuit 225.

In accordance with various embodiments, the DC power supply may be used as a current source, rather than a voltage source. In various embodiments, the DC power supply may be powered by a current source. The DC power supply may be powered by AC power, and the DC power supply may convert the AC power to DC power, such as by an AC to DC converter (not depicted in FIG. 2). Such AC power may be obtained through an electrical outlet or other AC power source. In various embodiments, the DC power supply may be powered by a battery.

In various embodiments, systems may use components or sub-systems with large power requirements. For example, a system may use a power amplifier 250 that requires a large amount of power to operate. Such a power amplifier 250 may be used when transmitting a communications signal via an antenna 252. In various embodiments, such components or sub-systems with large power requirements may use a separate power supply from the rest of the system. Use of a separate power supply may prevent or reduce the large power components and sub-systems from introducing noise or ripple effects on the power lines used by other parts of the system. Such an approach may add considerable additional weight and cost to a project. In various embodiments, the large power components and sub-systems may use the same (or overlapping portions of the same) power supply.

In various embodiments, a DC power supply comprises an active filter using a switching power supply with programmable current source. The circuit implementation may have a boost converter, central processing unit (CPU), holdup capacitor(s), voltage loop, current loop, and a high frequency filter. During times of low current consumption, the programmable current source may charge a hold-up capacitor that may be discharged when high current consumption is required. In this way, ripple may be greatly reduced without requiring external equipment to protect the rest of the system. Using a combination of a voltage loop and a current loop may reduce the AC input ripple by charging and discharging the output capacitor as the input ripples. The output of the holdup capacitor may feed a fast response power supply that may deliver a constant voltage to the load. In testing such a solution, the current ripple rejection shows 30 db (decibel) improvement with an overall efficiency of 90%.

Figure 3:
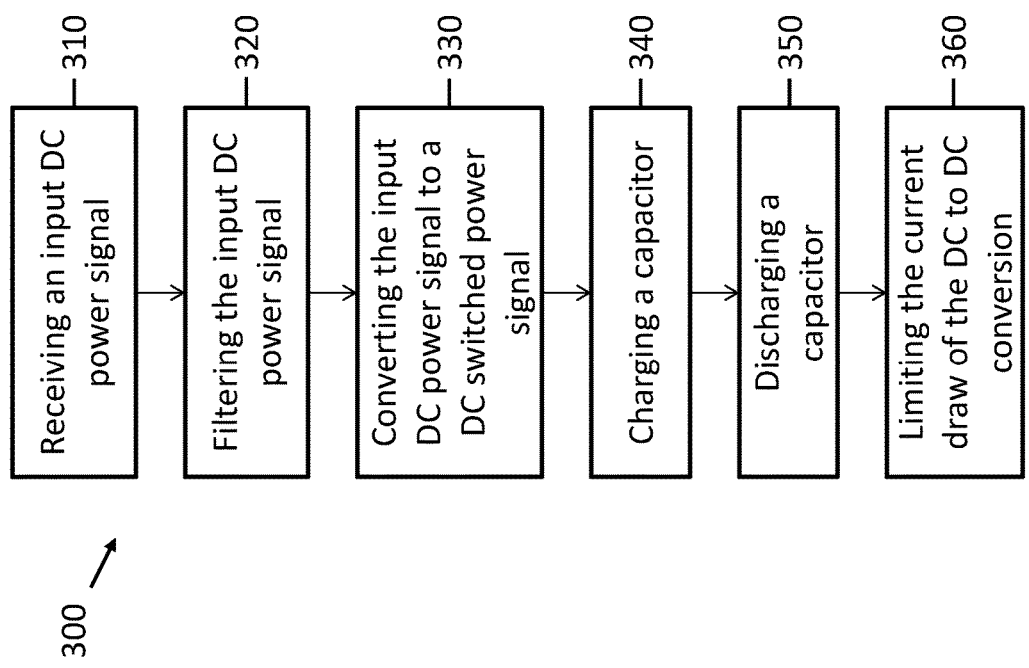
FIG. 3 shows a flowchart of operation of a DC power supply according to at least some embodiments.

FIG. 3 shows a flowchart of operation of a DC power supply 300, according to at least some embodiments. The method 300 comprises receiving an input DC power signal 310, for example at input terminals. The method 300 further comprises filtering the input DC power signal 320, such as using an active or passive filter. An active filter may comprise various known signal filtering techniques. A passive filter may comprise a RLC circuit. Filtering the input DC power signal 320 may be performed by a low-pass filter. The method 300 further comprises converting the input DC power signal to a DC switched power signal 330. The converting step 330 may be performed by a switch-mode DC to DC converter. The method 300 further comprises charging a capacitor 340. The capacitor may be coupled to a switch-mode DC to DC converter that performs the converting step 330. The charging a capacitor 340 may occur when the current draw on the switch-mode DC to DC converter is lower than the maximum current the switch-mode DC to DC converter can supply. The method 300 further comprises discharging a capacitor 350. The discharging a capacitor 350 may occur when the current draw on the switch-mode DC to DC converter is higher than the maximum current the switch-mode DC to DC converter can supply. The method comprises limiting the current draw of the DC to DC conversion 360. The limiting step 360 may occur when the current draw on the switch-mode DC to DC converter is higher than the maximum current the switch-mode DC to DC converter can supply. The limiting step 360 may limit the current draw by modifying the DC voltage value of the DC switched power signal being supplied by the switch-mode DC to DC converter.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Actions shown or discussed as happening while other actions happen are meant to have some overlap in time, and the two actions do not need to always happen together. Other examples of changes, substitutions, and alterations are ascertainable by one skilled in the art and may be made without departing from the spirit and scope disclosed herein.

What is claimed is:

1. An apparatus comprising:
a switch-mode DC to DC converter comprising an output terminal;
a current limit controller coupled to the switch-mode DC to DC converter and configured to limit a current draw of the switch-mode DC to DC converter; and
an accumulator coupled to the output terminal of the switch-mode DC to DC converter and configured to discharge to the output terminal of the switch-mode DC to DC converter while the switch-mode DC to DC converter is outputting an output DC voltage level to the output terminal and while the current limit controller is limiting the current draw of the switch-mode DC to DC converter, wherein the current draw of the switch-mode DC to DC converter is greater than zero.

2. The apparatus of claim 1, further comprising an isolating DC to DC converter coupled to the accumulator and the switch-mode DC to DC converter and configured to isolate the switch-mode DC to DC converter from a high-power component.

3. The apparatus of claim 2, further comprising a DC input filter, wherein the switch-mode DC to DC converter comprises two input terminals to receive input power, wherein the DC input filter is coupled to the two input terminals of the switch-mode DC to DC converter, and wherein the DC input filter rejects high-frequency noise.

4. The apparatus of claim 1, wherein the accumulator comprises a capacitor.

5. The apparatus of claim 1, further comprising a battery coupled to the switch-mode DC to DC converter and configured to provide DC power to the switch-mode DC to DC converter.

6. The apparatus of claim 1, wherein the switch-mode DC to DC converter converts an input DC voltage level to an output DC voltage level, and wherein the input DC voltage level is the same voltage level as the output DC voltage level.

7. The apparatus of claim 1, wherein the current limit controller limits the current draw of the switch-mode DC to DC converter based on the output DC voltage level and a reference voltage.

8. The apparatus of claim 1, wherein the current limit controller comprises a current limit output coupled to the switch-mode DC to DC converter in order to control a duty cycle of the switch-mode DC to DC converter.

9. An apparatus comprising:
a DC to DC converter comprising an output terminal;
a current limit controller coupled to the DC to DC converter and configured to limit a current draw of the DC to DC converter; and
an accumulator coupled to the output terminal of the DC to DC converter and configured to discharge to the output terminal of the DC to DC converter while DC to DC converter is outputting an output DC voltage level to the output terminal and while the current limit controller is limiting the current draw of the DC to DC converter, wherein the current draw of the DC to DC converter is greater than zero.

10. The apparatus of claim 9, further comprising:
an isolating DC to DC converter coupled to the accumulator and the DC to DC converter, wherein the isolating DC to DC converter is configured to isolate the DC to DC converter from a high-power component; and a DC input filter, wherein the DC to DC converter comprises two input terminals to receive input power, wherein the DC input filter is coupled to the two input terminals of the DC to DC converter, and wherein the DC input filter rejects high-frequency noise.

11. The apparatus of claim 10, wherein the DC to DC converter comprises two input terminals to receive a differential voltage input and two output terminals to provide a differential voltage output, wherein the accumulator is coupled across the two output terminals of the DC to DC converter, wherein the DC to DC converter converts an input DC voltage level received on the two input terminals to an output DC voltage level provided on the two output terminals.

12. The apparatus of claim 11, wherein the input DC voltage level is the same voltage level as the output DC voltage level.

13. The apparatus of claim 12, wherein the isolating DC to DC converter provides DC power to a power amplifier.

14. The apparatus of claim 9, further comprising a reference voltage coupled to the current limit controller.

15. A method comprising:
receiving, by a pair of input DC power terminals, an input DC power signal;
filtering, by an input filter, the input DC power signal;
converting, by a DC to DC converter, the input DC power signal to a switched power signal;
charging an accumulator, by the switched power signal;
discharging the accumulator to an output terminal of the DC to DC converter;
combining the switched power signal and the discharge of the accumulator at the output terminal; and
limiting, by a current limit controller, a current draw of the DC to DC converter while the accumulator is discharging, wherein the current draw of the DC to DC converter is greater than zero.

16. The method of claim 15, wherein the switched power signal is a DC power signal.

17. The method of claim 15, further comprising converting, by an isolated DC to DC converter, the switched power signal to an isolated power signal.

18. The method of claim 17, wherein the isolated power signal is a DC power signal.

19. The method of claim 18, further comprising providing the isolated power signal to a power amplifier.

20. The method of claim 15, further comprising:
receiving, by the current limit controller, a reference voltage value; and
receiving, by the current limit controller, a voltage value of the switched power signal, wherein the current limit controller limits the current draw of the DC to DC converter based on the reference voltage value and the voltage value of the switched power signal.

* * * * *